US007890202B2

(12) United States Patent
Arndt et al.

(10) Patent No.: US 7,890,202 B2
(45) Date of Patent: Feb. 15, 2011

(54) METHOD FOR CREATING WAFER BATCHES IN AN AUTOMATED BATCH PROCESS TOOL

(75) Inventors: Russell Herbert Arndt, Fishkill, NY (US); Michael Robert Biagetti, Fishkill, NY (US); Robert J. MacHugh, Newburgh, NY (US); Charles Jesse Taft, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 576 days.

(21) Appl. No.: 11/873,092

(22) Filed: Oct. 16, 2007

(65) Prior Publication Data

US 2009/0099681 A1 Apr. 16, 2009

(51) Int. Cl.
*G06F 19/00* (2006.01)
(52) U.S. Cl. .............. 700/112; 700/113; 700/121; 438/5; 438/7; 438/800; 414/222.02
(58) Field of Classification Search .......... 700/121, 700/112, 113; 438/5, 7, 800; 414/222.02
See application file for complete search history.

(56) References Cited

U.S. PATENT DOCUMENTS

| | | | |
|---|---|---|---|
| 3,845,286 A * | 10/1974 | Aronstein et al. ........ 700/102 |
| 6,053,694 A * | 4/2000 | Dill ........................ 414/778 |
| 6,303,398 B1 * | 10/2001 | Goerigk .................... 438/14 |
| 6,732,006 B2 * | 5/2004 | Haanstra et al. .......... 700/121 |
| 6,799,311 B1 * | 9/2004 | Ryskoski .................. 716/19 |
| 6,959,225 B1 * | 10/2005 | Logsdon et al. .......... 700/100 |
| 6,996,449 B2 * | 2/2006 | Imai ........................ 700/121 |
| 7,169,705 B2 * | 1/2007 | Ide et al. .................. 438/678 |
| 7,299,104 B2 * | 11/2007 | Tezuka et al. ............ 700/112 |

OTHER PUBLICATIONS

"A Review of Scheduling Theory and Methods for Semiconductor Manufacturing Cluster Tools", Tae-Eog Lee, Dept. of Industrial and Systems Engineering, 2008 Winter Simulation Conference, IEEE.*

* cited by examiner

*Primary Examiner*—Michael D Masinick
(74) *Attorney, Agent, or Firm*—Schmeiser, Olsen & Watts; Joseph Petrokaitis (57) ABSTRACT

A method of batching substrates in an automated processing tool, the automated process tool and a system for batching substrates in the automated process tool. The method includes selecting a first container containing a first group of substrates; simultaneously transferring each substrate of the first group of substrates into a batching station of the automated processing tool; selecting a second container containing a second group of substrates; selecting less than all substrates of the second group of substrates; and transferring each substrate of the less than all substrates of the second group of substrates to the batching station to form a third group of substrates.

30 Claims, 7 Drawing Sheets

METHOD FOR CREATING WAFER BATCHES IN AN AUTOMATED BATCH PROCESS TOOL

FIELD OF THE INVENTION

The present invention relates to the field of semiconductor batch process tools; more specifically, it relates a method of creating wafer batches, a tool running wafer batches, and a software system for directing the batch process tool to create wafer batches.

BACKGROUND OF THE INVENTION

Current batch processing tools that can process wafer batches that are larger than the number of wafers in containers of wafers that are delivered to the tool must have means for combining wafers from multiple containers into a single batch. In order to mechanically implement the transfer of wafers from multiple containers into a single batch. However, current tools are not optimized to perform batching and subsequent processing in the most time efficient manner and consequentially much tool capacity is wasted and the cost of production unnecessarily increased. Accordingly, there exists a need in the art to overcome the deficiencies and limitations described hereinabove.

SUMMARY OF THE INVENTION

A first aspect of the present invention is a method of batching substrates in an automated processing tool, comprising: selecting a first container containing a first group of substrates; simultaneously transferring each substrate of the first group of substrates into a batching station of the automated processing tool; selecting a second container containing a second group of substrates; selecting less than all substrates of the second group of substrates; and individually transferring each selected substrate of the less than all substrates of the second group of substrates to the batching station to form a third group of substrates.

A second aspect of the present invention is the first aspect further including: simultaneously processing each substrate of the third group of substrates through one or more processing stations of the automated processing tool; after the processing, simultaneously returning each substrate of the first group of substrates to the first container; and after the processing, individually returning each selected substrate of the less than all substrates of the second group of substrates to the second container.

A third aspect of the present invention is the second aspect, wherein the one or more processing stations includes one or more wet processing stations.

A fourth aspect of the present invention is the second aspect, wherein the one or more processing stations includes a drying station.

A fifth aspect of the present invention is the second aspect, further including: before the simultaneously processing each substrate of the third group of substrates, temporarily storing the third group of substrates in a buffer of the processing tool.

A sixth aspect of the present invention is the first aspect, wherein: the selecting less than all substrates of the second group of substrates is based on process recipe information associated with the first and second groups of substrates.

A seventh aspect of the present invention is the sixth aspect, wherein a first process recipe for the first group of substrates is the same as a second process recipe for the second group of substrates.

An eight aspect of the present invention is the first aspect, wherein the selecting less than all substrates of the second group of substrates is based on a number of substrates in the second container and positions of substrates within the second container.

A ninth aspect of the present invention is the first aspect, further including: simultaneously processing each substrate of the third group of substrates through one or more tanks, each tank of the one or more tanks containing a material independently selected from the group consisting of aqueous acids, aqueous bases, water, aqueous etchants, organic solvents at room temperature, organic solvents heated above room temperatures, organic solvent vapors, sulfuric acid, nitric acid, phosphoric acid, acetic acid, hydrofluoric acid, hydrofluoric acid mixed with ammonium fluoride aqueous tetramethyl ammonium hydroxide, ammonium hydroxide, basic photoresist developers alcoholic potassium hydroxide solutions, alcohols, esters, ketones, acetates, N-methylpyrrolidone, aliphatic solvents, cyclic solvents, benzene derivatives, fluoridated solvents, chlorinated solvents and combinations thereof.

A tenth aspect of the present invention is the first aspect, wherein the substrates are semiconductor wafers.

The invention also encompasses computer systems, automated batch processing tools and program products in machine-readable media for performing the methods of the invention.

These and other aspects of the invention are described in further detail below.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The embodiments of the present invention is described herein in reference to an exemplary automated batch processing tool having a capacity to process maximum batches of 50 wafers but restricted to receiving containers holding a maximum of 25 wafers into the load/unload port of the tool. An additional feature of the exemplary automated batch process tool is two different wafer transfer mechanisms, a first transfer mechanism which can transfer only one wafer at a time from a container holding up to 25 wafers into a batching station of the batch process tool and a second transfer mechanism which can only transfer all the wafers in a container holding up to 25 wafers into the batching station of the batch process tool. Consequentially, the computer system directing the various mechanical wafer handling mechanisms, particularly those dealing with creating batches of wafers, must be able to group wafers from two containers of wafers into a larger process batch.

The invention should not be construed to be limited to the particular numbers of 50 wafer maximum batches and 25 wafer maximum containers, but rather should be though of in general as being able to process batches of 1 to N wafers and handle containers holding 1 to M wafers, where N is greater than M. Similarly, the first transfer mechanism should be though of being able to transfer only one wafer at a time from a container of 1 to M wafers into the process batching station of the batch process tool and the second transfer mechanism should be thought of as being able to transfer all the wafers in a container that can hold up to M wafers into the process batching station of the batch process tool. Because of the limitation of the second transfer mechanism, which is described infra, all wafer containers advantageously can hold the same number of wafers. A particular type of wafer container is front opening unified pod (Foup), which is used in the exemplary tool described infra.

A wafer is a name given to a thin disk shaped semiconductor substrate having parallel top and bottom surfaces and an edge. In one example, wafers are about 300 mm in diameter and about 10 thick. The term horizontal is defined as a plane parallel to the surface of the earth and the term vertical is defined plane perpendicular to the plane of the earth.

A process recipe includes a list and sequence of the process stations a group of wafers called a wafer batch will be passed through and the time in each process station. Other process parameters besides time may also be included in the recipe.

It should be understood that, unless otherwise stated, unload operations are essentially the reverse of the load operations so a description of the load operation, method or software is essentially a description of the unload operation, method or software in reversed order.

Figure 1:
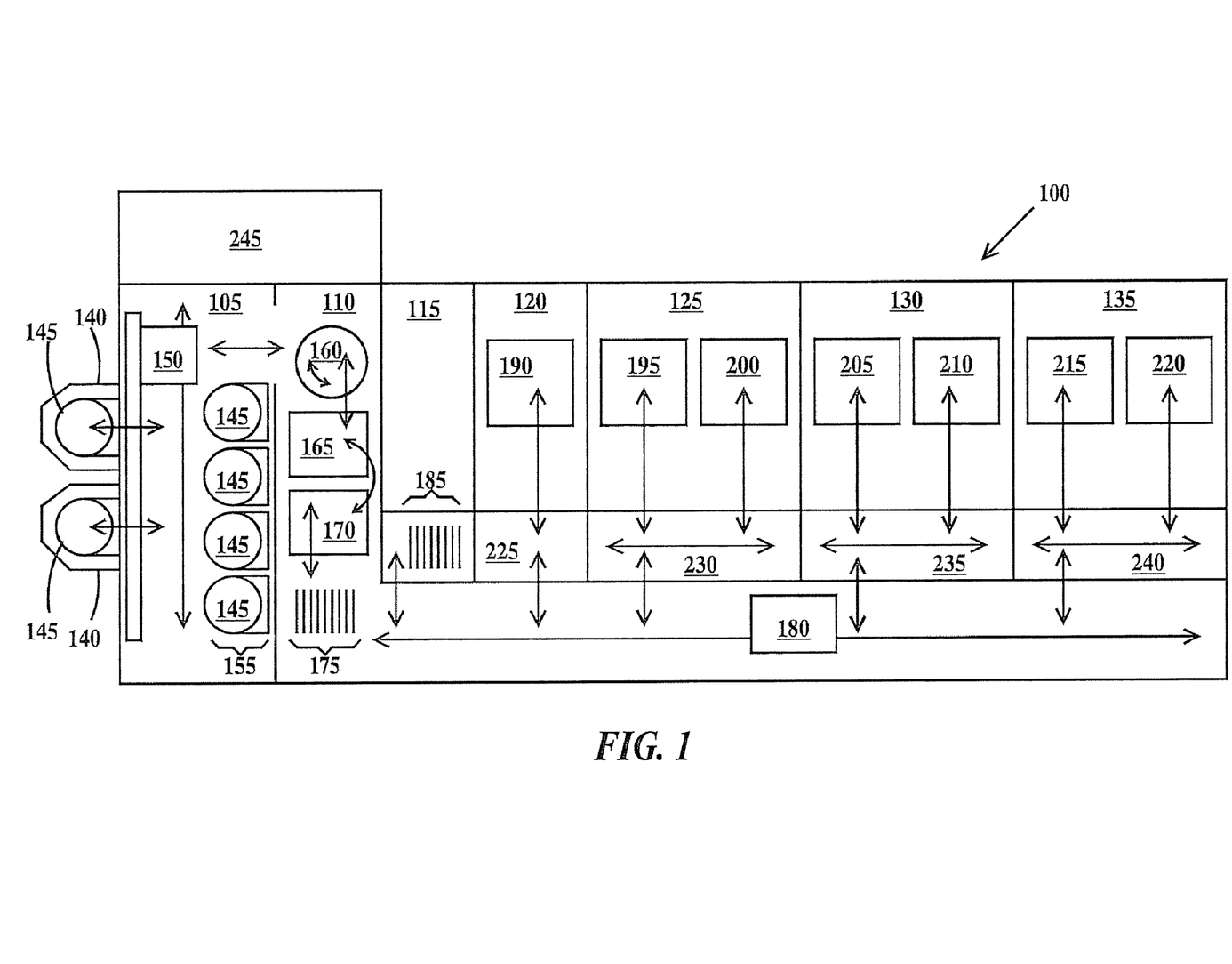
FIG. 1 is a schematic diagram of an exemplary batch process tool for practicing the embodiments of the present invention.

FIG. 1 is a schematic diagram of an exemplary batch process tool for practicing the embodiments of the present invention. In FIG. 1, a automated batch processing tool 100 includes a loading/storage section 105, a wafer transfer section 110, a buffer section 115, a drying station 120, and wet processing stations 125, 130 and 135.

A wet processing station includes tanks of liquid into which wafers are submerged. Those liquids include but are not limited to aqueous acids, aqueous bases, water, aqueous etchants, organic solvents at room temperature, and organic solvents heated above room temperatures. Wet processing station may also include tanks filled with organic solvent vapors. Examples of aqueous acids include, but are not limited to sulfuric acid, nitric acid, phosphoric acid, acetic acid, hydrofluoric acid and hydrofluoric acid mixed with ammonium fluoride and combinations thereof. Examples of aqueous bases include, but are not limited to aqueous tetramethyl ammonium hydroxide, ammonium hydroxide solutions, basic photoresist developers and alcoholic potassium hydroxide solutions. Examples of organic solvents include, but are not limited to alcohols, esters, ketones, acetates, N-methylpyrrolidone, aliphatic solvents, cyclic solvents, benzene derivatives, fluoridated solvents, chlorinated solvents and combinations thereof.

Loading/storage section 105 includes two load/unload stations 140 for loading and unloading Foups 145 containing 1 to 25 wafers into automated batch processing tool 100. Foups 145 can hold up to 25 wafers. Loading/storage section 105 includes a box (Foup) transfer robot BTR 150 which can move Foups 145 between load/unload stations 140, a Foup storage section 155 which hold up to 12 Foups and a horizontal transfer robot (HTR) 160 of wafer transfer section 110. Wafer transfer section also includes a horizontal to vertical carrier HVC 165, a pusher 170, a cassette transfer carrier (CTC) 175 and a wafer transfer robot (WTR) 180.

Wafers in Foups 145, when in batch process tool 100, are positioned horizontally (i.e., the top and bottom surfaces of the wafers are parallel to the horizontal planes defined supra). HTR 160 moves wafers to/from (HVC) 165. HTR 160 includes two mechanisms called end-effectors that transfers wafers between a Foup and HVC 165. The first end-effector has one vertically moveable wafer pick-up (i.e., is a single-finger end-effector) so it can only transfer individual wafers between HTR 160 and HVC 165. The second end-effector has 25 fingers (more generally, one wafer pick-up for each wafer position in a Foup) (i.e., is a multi-finger end-effector) and simultaneously transfers all the wafers currently in HTR 160 to HVC 165 or all the wafers currently in HVC 165 to HTR 160. It is the control of the wafer transfer between HTR 160 and HVC 165 to which some embodiments of the present invention are directed.

HVC 165 transfers wafers to/from pusher 170. In moving wafers from HVC 165 to pusher 170, all the wafers currently in HVC 165 are rotated so they are vertical (i.e., the top and bottom surfaces of the wafers are parallel to the vertical planes defined supra) when in pusher 170. In moving wafers from pusher 170 to HVC 165, all the wafers are rotated so in HVC 165 they are horizontal. From this point on though the remainder of wafer transfer station 110, buffer 115, drying station 120 and wet stations 125, 130 and 135 the wafers are positioned vertically.

Pusher 170 transfers wafers to/from CTC 175. CTC 175 is not a moveable cassette, but a set of slots for holding a batch of wafers (e.g., a batching station). While the maximum capacity of HTR 160, HVC 165 and pusher 170 is 25 wafers, CTC 175 has a maximum capacity of 50 wafers. Thus CTC 175 can hold up to all the wafers in two 25 wafer Foups. Thus wafer batches are physically created in CTC 175. All the wafers in a wafer batch will be processed through the various process stations as a group and see the same process recipe.

WTR 180 transfers wafers between CTC 175, from a 50 position cassette 185 of buffer 115, a 50 wafer position cassette (not shown) in drying station 120 and 50 wafer position cassettes (not shown) in wet process stations 125, 130 and 135. Cassette 185 is not a moveable cassette. WTR 180 has 50 wafer pick-ups so all the wafers in one location are transferred at the same time by WTR 180.

Drying station 120 includes a wafer dryer 190. Wet processing station 125 includes up to two wet processing tanks 195 and 200, though only one tank may be present. Wet processing station 130 includes up to two wet processing tanks 205 and 210, though only one tank may be present. Wet processing station 135 includes up to two wet processing tanks 215 and 230, though only one tank may be present. Cassettes in drying station 120 and wet process stations 125, 130 and 135 are dedicated to their respective stations. There may be one or two cassettes in each of wet processing stations 125, 130 and 135. The dedicated cassette of drying station 190 is transferred to/from dryer 190 by a cassette handler 225. The dedicated cassette(s) of wet station 125 are transferred between tanks 195 and 200 by a cassette handler 230. The dedicated cassette(s) of wet station 130 are transferred between tanks 205 and 210 by a cassette handler 235. The dedicated cassette(s) of wet station 130 are transferred between tanks 215 and 220 by a cassette handler 240. There may be fewer than three or more than three wet station in automated batch processing tool 100. In general processing starts in the station farthest from CTC 175 (e.g., station 230) and proceeds back toward CTC 175. Other sequential left to right arrangements of buffer 115, drying station 120 and wet stations 125, 130 and 135 may be substituted for the arrangement illustrated in FIG. 1. In a more general case, dryer 190, and wet tanks 195, 200, 205, 210, 215 and 220 are substations configure to perform fabrication steps.

Automated batch processing tool 100 also includes a tool computer 245, which may be a general-purpose computer or a dedicated computer configured to issue control signals to the hardware components of the automated batch processing tool. Automated batch processing tool 100 selects Foups 145, selects wafers from the Foups and controls the movement of Foups and wafers within tool 100 including the batching of wafers from two or more Foups into a wafer batch based on job command supplied by a production control computer (which itself may be a general-purpose computer) linked to computer 245.

An example of a batch process tool is a model FC3000 Wet Deck manufactured by Dianippon Screen (DNS) Mfg. Co., LTD, Kyoto, Japan. Embodiments of the present invention are directed to and may be practiced on this tool and similar tools. Embodiments of the present invention have been implemented on a DNS FC3000.

Figure 2:
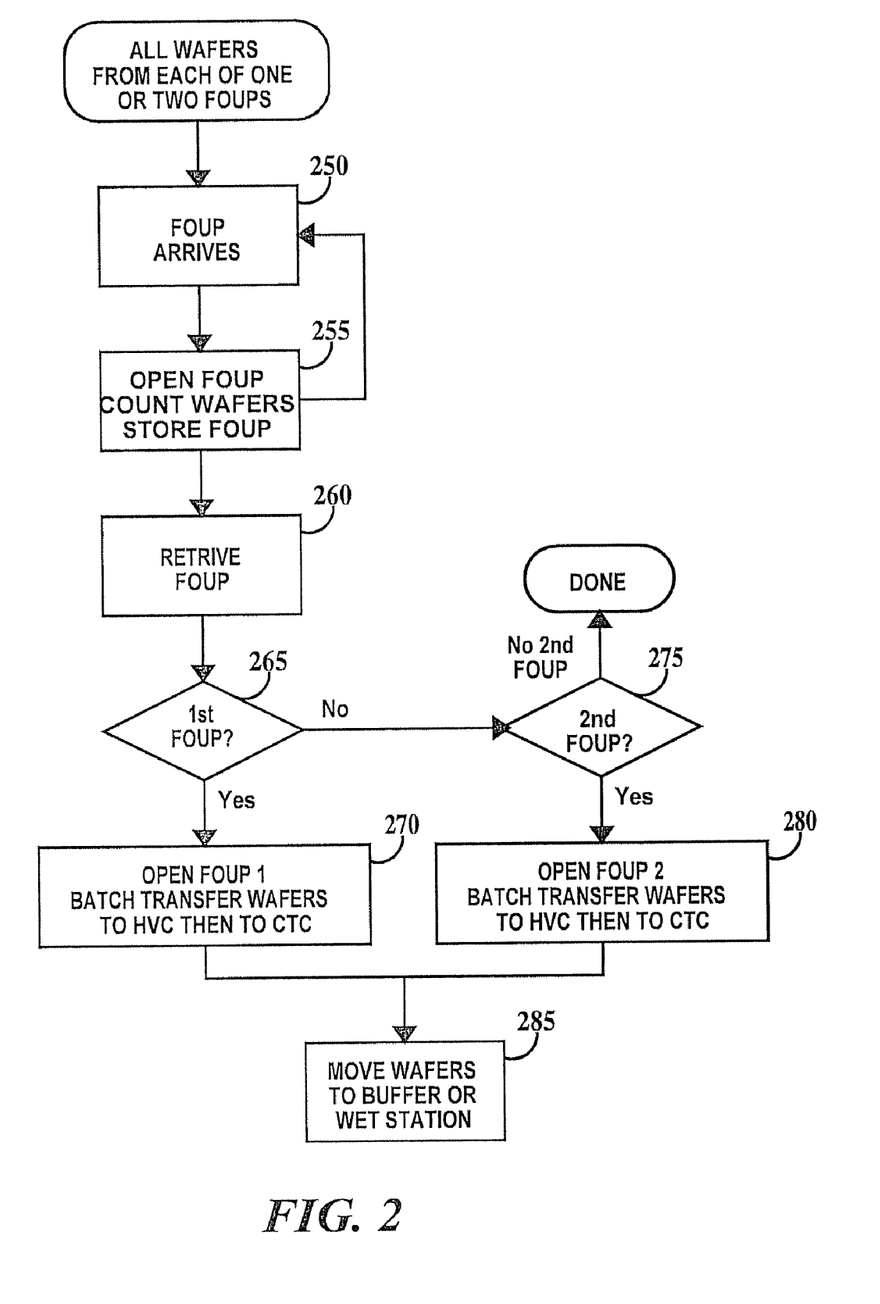
FIG. 2 is a flowchart of a first method of creating a wafer batch on the exemplary batch process tool of FIG. 1.

FIG. 2 is a flowchart of a first method of creating a wafer batch on the exemplary batch process tool of FIG. 1. Method one is applicable to the case where all wafers from one or two Foups are to be processed as a batch. In step 250, a Foup arrives at the batch processing tool and is loaded into the tool. In step 255, the Foup is automatically opened and the BTR verifies that there is a wafer in each slot that is listed in a job command sent to the tool by the production control computer, which also sent the recipe for the lot. Once, the wafer count and position is verified the Foup is stored the storage section of the tool. If not verified an alarm is issued for human intervention and the method will not proceed until corrections are made. Steps 250 and 255 are continually occurring as more Foups arrive at the tool. In step 260, a Foup is retrieved from the storage section of the tool by the BTR and placed on the HTR.

In step 265 it is determined if the current Foup on the HTR is a first Foup of a possible batch. If the current Foup is a first Foup, then in step 270 the HTR opens the first Foup, and all the wafers of the first Foup are simultaneously transferred to the HVC, then all the wafers in the HVC are simultaneously transferred to the pusher and then all the wafers in the pusher are simultaneously transferred to the CTC. If in step 265 there are already wafers from a first Foup in the CTC then the method proceeds to step 275. In step 275 it is determined if a second Foup has been retrieved in step 260. If a second Foup has been retrieved than in step 280 the HTR opens the second Foup, and all the wafers in the second Foup are simultaneously transferred to the HVC, then all the wafers in the HVC are simultaneously transferred to the pusher and then all the wafers in the pusher are simultaneously transferred to the CTC. Next step 285 is performed and all wafers in the CTC are simultaneously transferred to the buffer or a wet station. However, if no second Foup has been retrieved, then step 285 is performed only on wafers from the first Foup. In one, example, this occurs because there is no other Foup in the tool containing wafers to be processed with the same recipe as all the wafers in the first Foup. Unloading reverse the steps just described.

Figure 3:
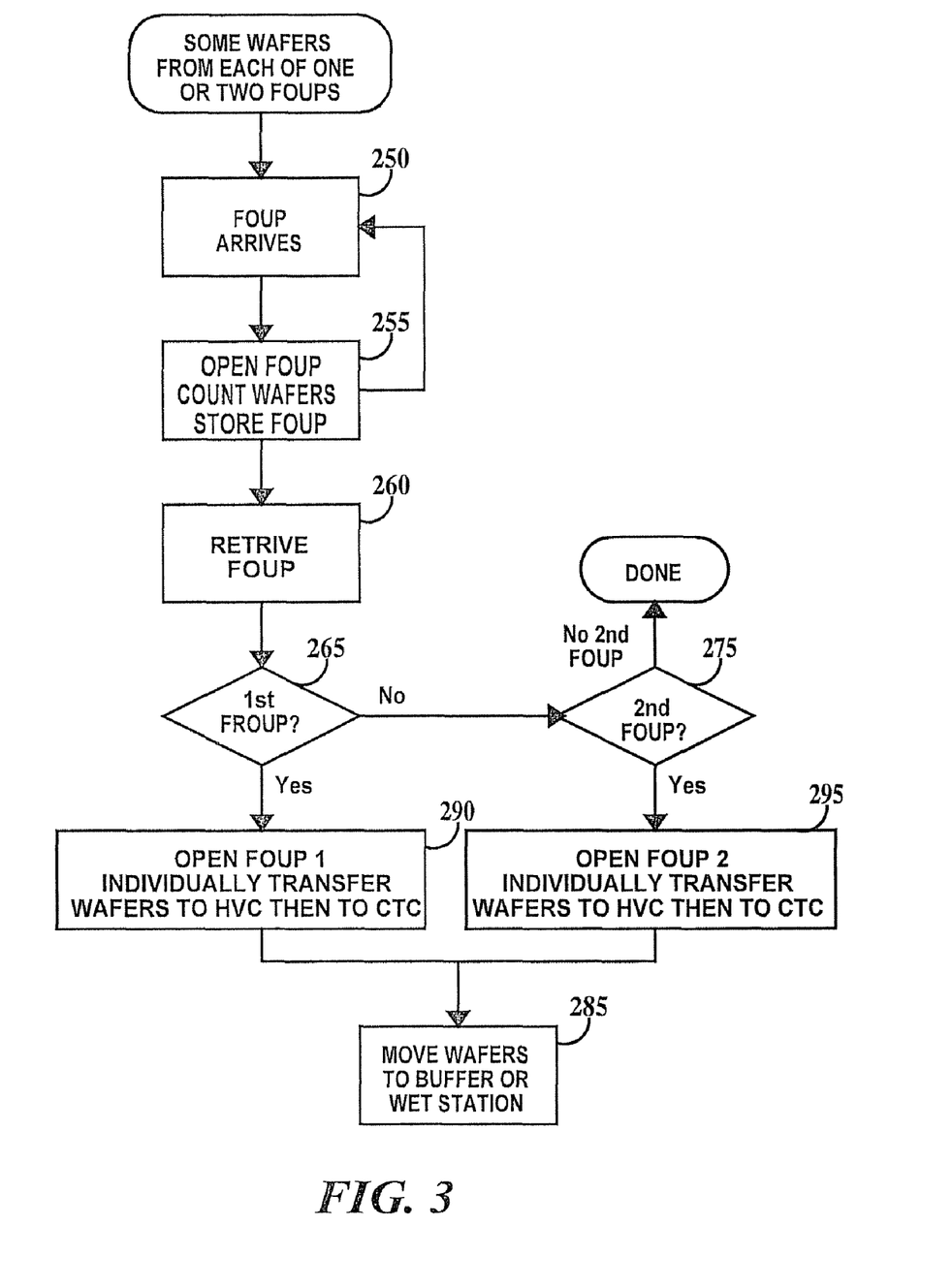
FIG. 3 is a flowchart of a second method for creating a batch of selected wafer on the exemplary batch process tool illustrated in FIG. 1.

FIG. 3 is a flowchart of a second method for creating a batch of selected wafer on the exemplary batch process tool illustrated in FIG. 1. Method two is applicable to the case where some but not all wafers from one or two Foups are to be processed as a batch. FIG. 3 is similar to FIG. 2 except steps 270 and 280 of FIG. 2 are replaced respectively with steps 290 and 295. In step 265 it is determined if the current Foup on the HTR is a first Foup of a possible batch. If the current Foup is a first Foup, then in step 290 the HTR opens the first Foup, and some but not all of the wafers from the first Foup are individually transferred to the HVC, then all the wafers on the HVC are simultaneously transferred to the pusher and then all the wafers on the pusher are simultaneously transferred to the CTC. If in step 265 there are already wafers from a first Foup in the CTC then the method proceeds to step 275. In step 275 it is determined if a second Foup has been retrieved in step 260. If a second Foup has been retrieved than in step 295 the HTR opens the second Foup, and all the wafers in the second Foup are simultaneously transferred to the HVC, then all the wafers in the HVC are simultaneously transferred to the pusher and then all the wafers in the HVC are simultaneously transferred to the CTC. Next step 285 is performed and all wafers in the CTC are simultaneously transferred to the buffer or a wet station. However, if no second Foup has been retrieved, then step 285 is performed only on wafers from the first Foup. In one, example, this occurs because there is no other Foup in the tool containing wafers to be processed with the same recipe as all the wafers in the first Foup. Unloading reverse the steps just described.

Figure 4:
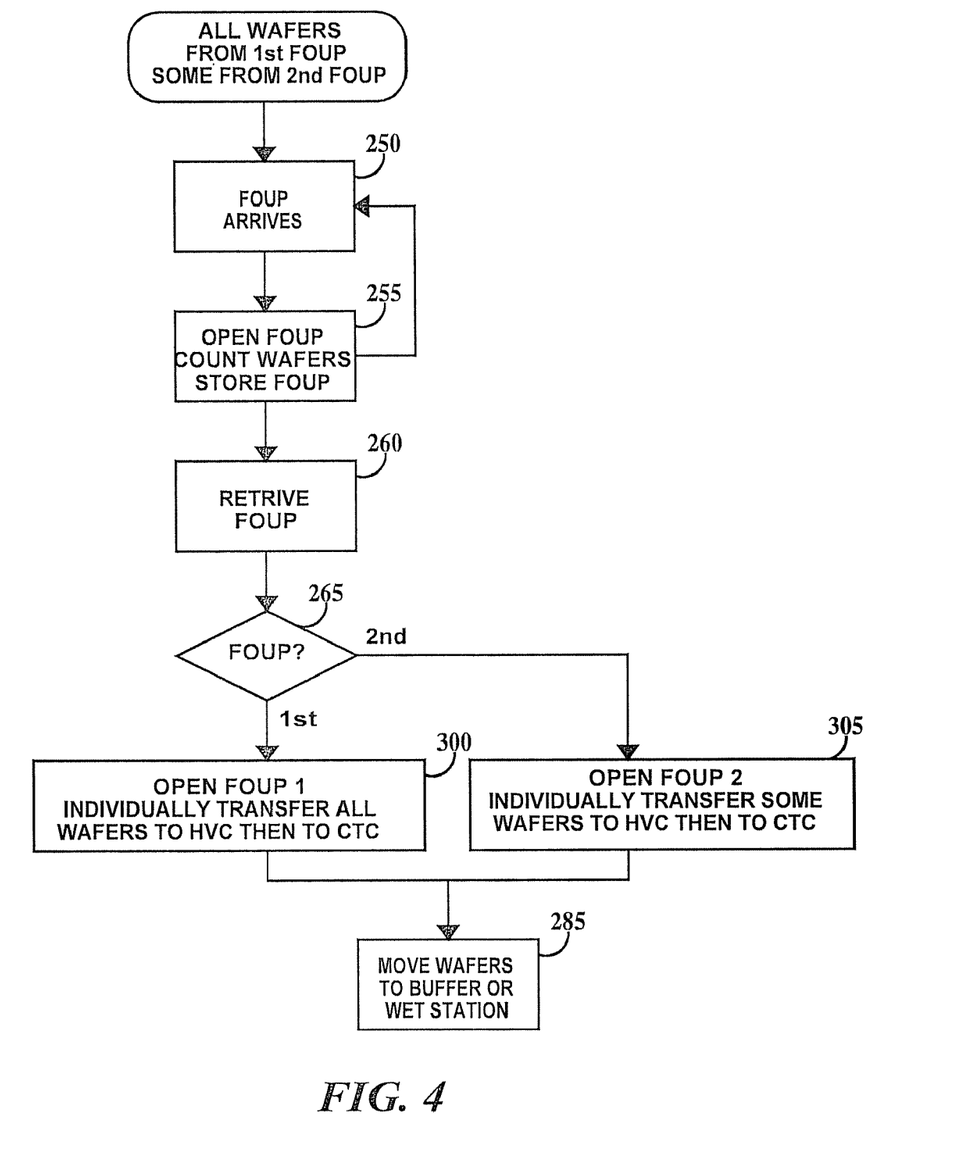
FIG. 4 is a flowchart of a third method of creating a wafer batch on the exemplary batch process tool illustrated in FIG. 1.

FIG. 4 is a flowchart of a third method of creating a wafer batch on the exemplary batch process tool illustrated in FIG. 1. Method three is applicable to the case where all wafers from a first Foup and some but not all wafers from a second Foup are to be processed as a batch. FIG. 4 is similar to FIG. 2 except steps 270 and 280 of FIG. 2 are replaced respectively with steps 300 and 305 and step 275 of FIG. 2 is not present. In step 265 it is determined if the current Foup on the HTR is a first Foup or a second Foup of a batch. If the current Foup is a first Foup, then in step 300 the HTR opens the first Foup, and all of the wafers from the first Foup are individually transferred to the HVC, then all the wafers on the HVC are simultaneously transferred to the pusher and then all the wafers on the pusher are simultaneously transferred to the CTC. If in step 265, the current Foup is a second Foup, then in step 305 the HTR opens the first Foup, and some but not all of the wafers from the first Foup are individually transferred to the HVC, then all the wafers on the HVC are simultaneously transferred to the pusher and then all the wafers on the pusher are simultaneously transferred to the CTC. Next step 285 is performed and all wafers in the CTC are simultaneously transferred to the buffer or a wet station. Unloading reverse the steps just described.

Figure 5:
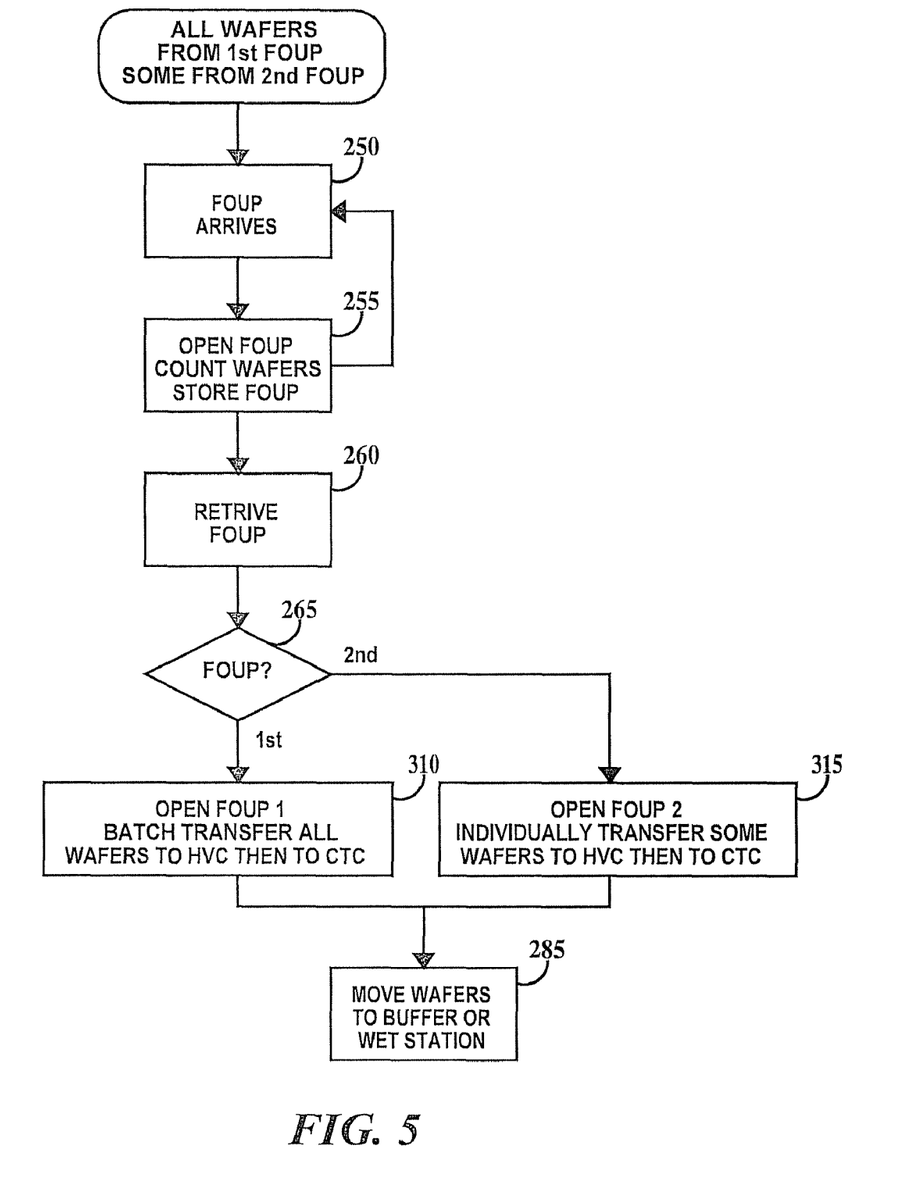
FIG. 5 is a flowchart of a fourth method of creating a wafer batch on the exemplary batch process tool illustrated in FIG. 1.

FIG. 5 is a flowchart of a fourth method of creating a wafer batch on the exemplary batch process tool illustrated in FIG. 1. Method four is applicable to the case where all wafers from a first Foup and some but not all wafers from a second Foup are to be processed as a batch. FIG. 5 is similar to FIG. 2 except steps 270 and 280 of FIG. 2 are replaced respectively with steps 310 and 315 and step 275 of FIG. 2 is not present. In step 265 it is determined if the current Foup on the HTR is a first Foup or a second Foup of a batch. If the current Foup is a first Foup, then in step 310 the HTR opens the first Foup, and all of the wafers from the first Foup are simultaneously transferred to the HVC, then all the wafers on the HVC are simultaneously transferred to the pusher and then all the wafers on the pusher are simultaneously transferred to the CTC. If in step 265, the current Foup is a second Foup, then in step 315 the HTR opens the first Foup, and some but not all of the wafers from the first Foup are individually transferred to the HVC, then all the wafers on the HVC are simultaneously transferred to the pusher and then all the wafers on the pusher are simultaneously transferred to the CTC. Next step 285 is performed and all wafers in the CTC are simultaneously transferred to the buffer or a wet station. Unloading reverse the steps just described.

It should be understood in FIGS. 2, 3, 4 and 5, the loading and unloading of first and second Foups may be reversed. Using the example that it takes 50 seconds before an arriving Foup can be verified, opening and verifying a Foup takes 40 seconds, simultaneously transferring wafers from a Foup to the CTC takes 120 seconds, simultaneously transferring wafers from the CTC to a wet station takes 145 second, individually transferring a wafer from a Foup to the HVC takes 15 seconds, and simultaneously transferring wafers from the HVC to CTC takes 45 seconds, the approximate times to batch a group of wafers to be processed together from the arrival of the Foup(s) to the delivery of wafers for the four methods is given in table I.

TABLE I

Approximate times to Deliver the Stated Number of Wafers to a Wet Station

| METHOD | Wafers Foup 1 | Wafers Foup 2 | Wafers Total | Time |
|---|---|---|---|---|
| 1 | 25 | 25 | 50 | 360 sec |
| 2 | 1 | 1 | 2 | 300 sec |
| 3 | 25 | 2 | 27 | 720 sec |
| 4 | 25 | 2 | 27 | 420 sec |

From table I, it is readily apparent that:
(1) The first method (FIG. 2) while the most efficient cannot handle Foups from which less than all wafers are selected.
(2) The second method (FIG. 3), is only efficient when small numbers of wafers are involved, but is the only way to handle less than all wafers from each of two Foups.
(3) The third method (FIG. 4) is very inefficient.
(3) The fourth method (FIG. 5) results in an increase in productivity over the third method (FIG. 4).

There are two components to wafer batching, a hardware component and a software component. Automated batch processing tool 100 (see FIG. 1) can physically perform each of methods one through four for batching wafers described supra. However, software must be installed in tool computer 245 (see FIG. 1) to allow implementation of the four methods. Thus, because the fourth method is so much more efficient than the third method, there is actually no need to provide software capability for the third method.

Figure 6:
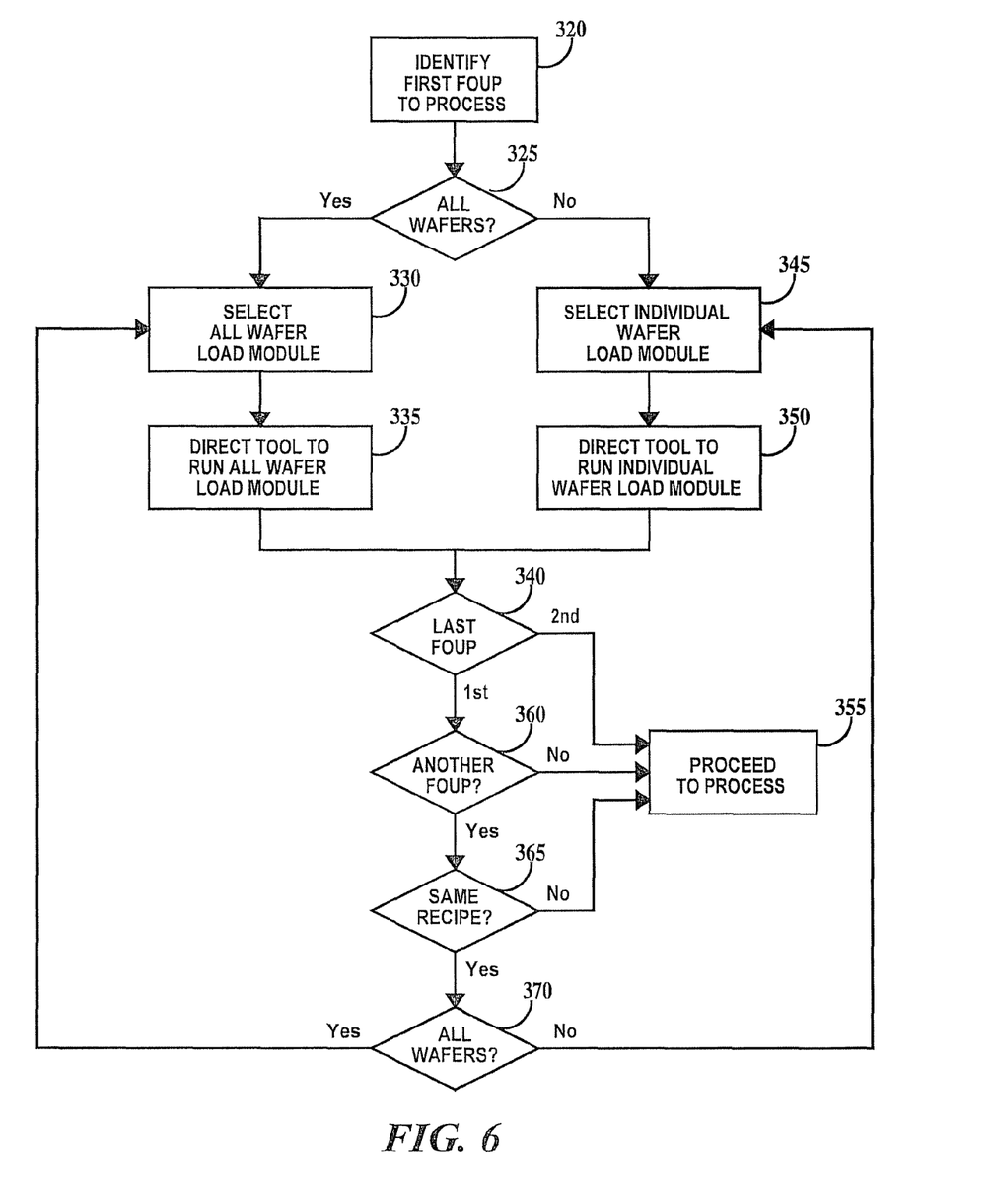
FIG. 6 is a flowchart illustrating tool control steps for creating a wafer batch in the exemplary batch process tool illustrated in FIG. 1.

FIG. 6 is a flowchart illustrating computer controlled tool control steps for creating a wafer batch in the exemplary batch process tool illustrated in FIG. 1. In FIG. 1, all steps are performed by a computer system dedicated to running the batch tool itself (hereinafter the tool computer) as opposed to a production control computer. The production control computer supplies a job command which includes a number of wafers in a Foup to processes, the positions (e.g., slots) those wafers are occupying in the Foup and a process recipe for those wafers. A Foup may contain more wafers than the job command for that Foup.

In step 320, a first FOUP for processing is selected. In one example, the selection is based on a priority established by the production control system. In one example, the selection is based on time in queue (e.g., a first-in-first-out (FIFO)) rule.

In one example, the selection is based on not allowing a process window to expire, the process window established by the production control system. The same selection criteria may be applied to selecting the second Foup as described infra.

In step 325, it is determined if all the wafers in the first Foup are one lot. This is accomplished by comparing the number of wafers in the Foup to the number of wafers requested to be processed in the batch load command. If the number of wafers in the Foup is equal to that in the job command (i.e., the number of wafers being requested to process), then the answer is yes and the method proceeds to step 330.

In step 330 the tool computer selects the all wafer load module an in step 335 directs the tool to execute the all wafer load module on Foup 1. A module is a set of instructions issued by the tool computer to the electro/mechanical devices of the tool. In its simplest form, this is an instruction to use the multi-finger end-effector. The method then proceeds to step 340.

If in step 325, the number of wafers in the Foup is greater than that in the job command, then the answer is no and the method proceeds to step 345. If the number of wafers in the Foup is less than the number being requested to process an error and/or alarm is generated.

In step 345 the tool computer selects the individual wafer load module an in step 350 directs the tool to execute the individual wafer load module on Foup 1. In its simplest form, this is an instruction to use the single-finger end-effector. Execution of the individual wafer load module utilizes the slot position information provided by the production control computer. The method then proceeds to step 340.

In step 340, it is determined if the last loaded Foup was the second Foup. If the loaded Foup was a second Foup then the method proceeds to step 355 where the wafers are sent onto a process station or a buffer (e.g. sent from CTC 175 to buffer 115 or process station 134 of FIG. 1). If in step 340, the last loaded Foup was a first Foup then the method proceeds to step 360.

In step 360 it is determined if another Foup is available in the tools storage area. If not, the method proceeds to step 355, otherwise to step 365.

In step 365 it is determined if a lot in any other Foup has the same process recipe as the first Foup. If not, the method proceeds to step 355, otherwise to step 370. Step 370 performs the same function as step 325 except on the second Foup and the method branches to either step 330 or step 345.

It should be appreciated in steps 330 and 345, that the production control computer has essentially issued the same type of command to select wafers in both Foups and that the tool computer has made the decision as which end-effector to use. This is opposed to prior art methodologies which required two different type job commands to batch wafers, a first type when all wafers in a Foup were to be selected and a second type when less than all of the wafers in a Foup were to be selected. Further, prior art methods of loading both Foups required using the single finger end-effector for both Foups or using the multi-finger end selector for both Foups. This resulted in the wasted time of method 3 (FIG. 4). In the prior art methodology, ultimately it was the production control computer that selected the end-effector, not the tool control computer as in the embodiments of the present invention.

Figure 7:
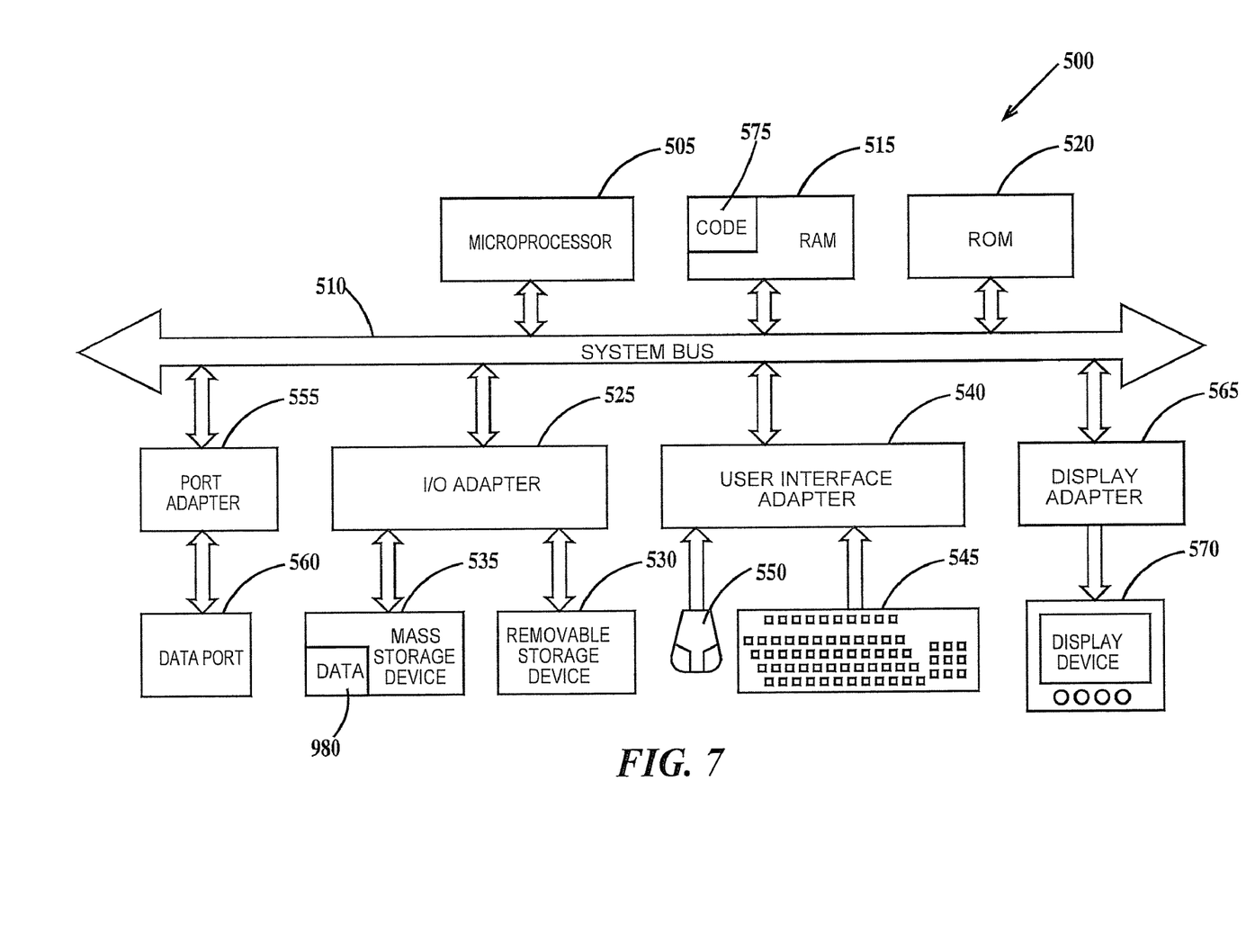
FIG. 7 is a schematic block diagram of a computer for practicing the embodiments of the present invention.

FIG. 7 is a schematic block diagram of a computer for practicing the embodiments of the present invention. In FIG. 7, computer system 500 has at least one microprocessor or central processing unit (CPU) 505. CPU 505 is interconnected via a system bus 510 to a dynamic random access memory (DRAM) device 515 and a read-only memory (ROM) device 520, an input/output (I/O) adapter 525 for a connecting a removable data and/or program storage device 530 and a mass data and/or program storage device 535, a user interface adapter 550 for connecting a keyboard 555 and a mouse 550, a port adapter 555 for connecting a data port 560 and a display adapter 565 for connecting a display device 570.

Either of devices 515 and 520 includes contains the basic operating system for computer system 500. Removable data and/or program storage device 530 may be a magnetic media such as a floppy drive, a tape drive or a removable hard disk drive or optical media such as CD ROM or a digital video disc (DVD) or solid state memory such as ROM or DRAM or flash memory. Mass data and/or program storage device 535 may be a hard disk drive or an optical drive. In addition to keyboard 555 and mouse 550, other user input devices such as trackballs, writing tablets, pressure pads, microphones, light pens and position-sensing screen displays may be connected to user interface 550. Examples of display devices include cathode-ray tubes (CRT) and liquid crystal displays (LCD).

One of devices 515, 520, 530 or 535 includes a computer code 575 (illustrated by way of example in device 515), which is a computer program that comprises computer-executable instructions. Computer code 575 includes an algorithm for creating a wafer batch on the exemplary batch process tool (e.g., the algorithm of FIG. 6). CPU 505 executes computer code 575. Any of devices 515, 520, 530 or 535 may include input data 580 (illustrated by way of example in device 535) required by computer code 575. Display device 570 displays output from computer code 575.

Any or all of devices 515, 520, 530 and 535 (or one or more additional memory devices not shown in FIG. 7) may be used as a computer usable medium (or a computer readable medium or a program storage device) having a computer readable program embodied therein and/or having other data stored therein, wherein the computer readable program comprises computer code 575. Generally, a computer program product (or, alternatively, an article of manufacture) of the computer system 500 may comprise the computer usable medium (or the program storage device).

Thus the present invention discloses a process for supporting computer infrastructure, integrating, hosting, maintaining, and deploying computer-readable code into the computer system 500, wherein the code in combination with the computer system 500 is capable of performing a method for creating a wafer batch on the exemplary batch process tool.

Thus, the embodiments of the present invention, by providing software modules that can create wafer batches in a more time efficient manner than hereto before possible overcome the deficiencies and limitations described supra.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of batching substrates in an automated processing tool, comprising:

selecting a first container containing a first group of substrates;

simultaneously transferring each substrate of said first group of substrates into a processing container in a batching station of said automated processing tool;

selecting a second container containing a second group of substrates;

selecting less than all substrates of said second group of substrates; and individually transferring only selected substrates of said second group of substrates to said processing container to form a third group of substrates.

2. The method of claim 1, further including:

while in said processing container, simultaneously processing each substrate of said third group of substrates through one or more processing stations of said automated processing tool;

after said processing, simultaneously returning each substrate of said first group of substrates to said first container; and after said processing, individually returning each selected substrate of said less than all substrates of said second group of substrates to said second container.

3. The method of claim 2, further including:

before said simultaneously processing each substrate of said third group of substrates, removing said first and second groups of substrates from said first and second containers and temporarily storing said first and second groups of substrates in a buffer of said processing tool.

4. The method of claim 1, wherein:

said selecting less than all substrates of said second group of substrates is based on process recipe information associated with said first and second groups of substrates.

5. The method of claim 4, wherein a first process recipe for said first group of substrates is the same as a second process recipe for said second group of substrates.

6. The method of claim 1, wherein said selecting less than all substrates of said second group of substrates is based on a number of substrates in said second container and positions of substrates within said second container.

7. The method of claim 1, further including:

while in said processing container, simultaneously processing each substrate of said third group of substrates through one or more tanks, each tank of said one or more tanks containing a material independently selected from the group consisting of aqueous acids, aqueous bases, water, aqueous etchants, organic solvents at room temperature, organic solvents heated above room temperatures, organic solvent vapors, sulfuric acid, nitric acid, phosphoric acid, acetic acid, hydrofluoric acid, hydrofluoric acid mixed with ammonium fluoride aqueous tetramethyl ammonium hydroxide, ammonium hydroxide, basic photoresist developers alcoholic potassium hydroxide solutions, alcohols, esters, ketones, acetates, N-methylpyrrolidone, aliphatic solvents, cyclic solvents, benzene derivatives, fluoridated solvents, chlorinated solvents and combinations thereof.

8. A method of batching substrates in an automated processing tool, comprising:

selecting, from a storage area of said processing tool, a first container containing a first group of substrates;

simultaneously transferring each substrate of said first group of substrates into a processing container in a batching station of said automated processing tool;

determining a process recipe of said first group of substrates;

determining if a second container in said storage area includes substrates having said process recipe;

if said second container including substrates having said process recipe exists, either (i) when all substrates of said second container do not have said process recipe, selecting only substrates of said second container having said process recipe; and individually transferring only those substrates of said second container having said process recipe to said processing container to form a third group of substrates, or (ii) when all substrates of said second container have said process recipe, selecting all substrates of said second container and simultaneously transferring all substrates of said second container into said processing container to form said third group of substrates; and wherein said selecting in (i) is further based on a number of substrates in said second container and the position of each substrate within said second container and said selecting in (ii) is further based on a number of substrates in said second container and the position of each substrate within said second container.

9. The method of claim 8, further including:

while in said processing container, simultaneously processing each substrate of said third group of substrates through one or more processing stations of said automated processing tool;

after said processing, simultaneously returning each substrate originally from said first container back to said first container; and after said processing, individually returning each substrate originally from said second container back to said second container.

10. The method of claim 9, further including:

before said simultaneously processing each substrate of said third group of substrates, removing said first and second groups of substrates from said first and second containers and temporarily storing said first and second groups of substrates in a buffer of said processing tool.

11. The method of claim 8, wherein said selecting said first container is based on a priority of said first container, an amount of time said first container has been in a storage area of said automated process tool or not allowing a process window to expire.

12. The method of claim, 8 further including when two or more potential second containers exist, selecting said second container, based on a priority of said second container, an amount of time said second container has been in a storage area of said automated process tool or not allowing a process window to expire.

13. The method of claim 8, further including:

while in said processing container, simultaneously processing each substrate of said third group of substrates through one or more tanks, each tank of said one or more tanks containing a material independently selected from the group consisting of aqueous acids, aqueous bases, water, aqueous etchants, organic solvents at room temperature, organic solvents heated above room temperatures, organic solvent vapors, sulfuric acid, nitric acid, phosphoric acid, acetic acid, hydrofluoric acid, hydrofluoric acid mixed with ammonium fluoride aqueous tetramethyl ammonium hydroxide, ammonium hydroxide, basic photoresist developers alcoholic potassium hydroxide solutions, alcohols, esters, ketones, acetates, N-methylpyrrolidone, aliphatic solvents, cyclic solvents, benzene derivatives, fluoridated solvents, chlorinated solvents and combinations thereof.

14. A computer system comprising a processor, an address/data bus coupled to said processor, and a computer-readable memory unit coupled to communicate with said processor, said memory unit containing instructions that when executed by the processor implement a method of batching substrates in an automated processing tool, said method comprising the computer implemented steps of:

selecting a first container containing a first group of substrates;

transmitting a control signal to simultaneously transfer all substrates of said first group of substrates into a processing container in a batching station of said automated processing tool;

selecting a second container containing a second group of substrates;

selecting less than all substrates of said second group of substrates; and transmitting a control signal to individually transfer only selected substrates of said second group of substrates to said processing container to form a third group of substrates.

15. The computer system of claim 14, the method further including the steps of:

transmitting control signals to, while in said processing container, simultaneously process each substrate of said third group of substrates through one or more processing stations of said automated processing tool;

after said processing, transmitting control signals to simultaneously return all substrates of said first group of substrates to said first container; and after said processing, transmitting control signals to individually return each selected substrate of said less than all substrates of said second group of substrates to said second container.

16. The computer system of claim 15, the method further including the step of:

before said transmitting control signals to simultaneously processing each substrate of said third group of substrates, transmitting control signals to remove said first and second groups of substrates from said first and second containers and temporarily store said first and second groups of substrates in a buffer of said processing tool.

17. The computer system of claim 14, wherein said method step of selecting less than all substrates of said second group of substrates is based on process recipe information associated with said first and second groups of substrates.

18. The computer system of claim 17, wherein a first process recipe for said first group of substrates is the same as a second process recipe for said second group of substrates.

19. The computer system of claim 14, wherein said method step of said selecting less than all substrates of said second group of substrates is based on a number of substrates in said second container and positions of substrate within said second container.

20. The computer system of claim 14, further including the method step of:

between said selecting a first container and said transmitting control signals to simultaneously transfer all substrates of said first group of substrates, determining an actual number of wafers in said first container and selecting a multi-finger end-effector for performing said transferring, said selecting said multi-finger end-effector based on said actual number of substrates in said first container being equal to a number of wafers indicated as being in said first container in a job command issued to said automated process tool by a production control system.

21. The computer system of claim 14, further including the method step of:
   between said selecting a second container and said transmitting control signals to individually transfer each substrate of said second group of substrates, determining an actual number of wafers in said first container and selecting a single-finger end-effector for performing said transferring, said selecting said single-finger end-effector based on said actual number of substrates in said first container being greater than a number of wafers indicated as being in said first container in a job command issued to said automated process tool by a production control system.

22. A computer system comprising a processor, an address/data bus coupled to said processor, and a computer-readable memory unit coupled to communicate with said processor, said memory unit containing instructions that when executed by the processor implement a method batching substrates in an automated processing tool, said method comprising the computer implemented steps of:
   selecting, from a storage area of said processing tool, a first container containing a first group of substrates;
   transmitting control signals to simultaneously transfer all substrates of said first group of substrates into a processing container of a batching station of said automated processing tool;
   determining a process recipe of said first group of substrates;
   determining if a second container in said storage area includes substrates having said process recipe;
   if said second container includes substrates having said process recipe exists, either (i) when all substrates of said second container do not have said process recipe, selecting only substrates of said second group of substrates having said process recipe and transmitting control signals to individually transfer only those substrates of said second container having said process recipe to said processing container to form a third group of substrates, or (ii) when all substrates of said second container have said process recipe, transmitting control signals to simultaneously transfer all substrates of said second container of substrates into said processing container to form said third group of substrates; and
   wherein said selecting in (i) is further based on a number of substrates in said second container and the position of each substrate within said second container and said selecting in (ii) is further based on a number of substrates in said second container and the position of each substrate within said second container.

23. The computer system of claim 22, the method further including the steps of:
   transmitting control signals to, while in said processing container, simultaneously process all substrates of said third group of substrates through one or more processing stations of said automated processing tool;
   after said processing, transmitting control signals to simultaneously return each substrate originally from said first container back to said first container; and
   after said processing, transmitting control signals to individually return each substrate originally from said second container back to said second container.

24. The computer system of claim 23, the method further including the step of:
   before said transmitting control signals to simultaneously process each substrate of said third group of substrates, transmitting control signals to remove said first and second groups of substrates from said first and second containers and temporarily store said first and second groups of substrates in a buffer of said processing tool.

25. The computer system of claim 22, wherein said method step of selecting said first container is based on a priority of said first container, an amount of time said first container has been in a storage area of said automated process tool or not allowing a process window to expire.

26. The computer system of claim 22, wherein said method step of selecting said second container is based on a priority of said first container, an amount of time said first container has been in a storage area of said automated process tool or not allowing a process window to expire.

27. The computer system of claim 22, further including the method step of:
   before said transmitting control signals to transfer all substrates of said first group of substrates into a batching station, selecting a multi-finger end-effector for performing said simultaneously transferring each substrate of said first group of substrates into a batching station, said selecting said multi-finger end-effector based on a number of substrates in said first container being equal to a number of wafers indicated as being in said first container in a job command issued to said automated process tool by a production control system.

28. The computer system of claim 22, the method steps further including in (i):
   selecting a single-finger end-effector for performing said transferring, said selecting said single-finger end-effector based on said number of substrates in said second container being greater than a number of wafers indicated as being in said second container in a job command issued to said automated process tool by a production control system.

29. The computer system of claim 22, the method steps further including in (ii):
   selecting a multi-finger end-effector for performing said transferring, said selecting said multi-finger end-effector based on said number of substrates in said second container being greater than a number of wafers indicated as being in said second container in a job command issued to said automated process tool by a production control system.

30. A computer program product comprising a computer useable medium including a computer readable program therein, wherein the computer readable program when executed on a computer causes the computer to:
   select, from a storage area of a processing tool, a first container containing a first group of substrates;
   transmit control signals to said processing tool simultaneously transfer all substrates of said first group of substrates into a processing container in a batching station of said automated processing tool;
   determine a process recipe of said first group of substrates;
   determine if a second container in said storage area includes substrates having said process recipe;
   determine if a second container in said storage area includes substrates having said process recipe;
   if said second container exists, determine a number of substrates in said second container and the position of each substrate within said second container; and if said second container includes substrates having said process recipe exists, either (i) when all substrates of said second container do not have said process recipe, issuing instruction to said processing tool to select only substrates of said second group of substrates having said process recipe and to transmit control signals to individually transfer only those substrates of said second container having said process recipe to said processing container to form a third group of substrates, or (ii) when all substrates of said second container have said process recipe, issuing instructions to said processing tool to transmit control signals to simultaneously transfer all substrates of said second container of substrates into said processing container to form said third group of substrates.

* * * * *